US012633909B2

(12) United States Patent
Shimizu et al.

(10) Patent No.: US 12,633,909 B2
(45) Date of Patent: May 19, 2026

(54) OUTPUT CIRCUIT

(71) Applicant: Socionext Inc., Kanagawa (JP)

(72) Inventors: Kyota Shimizu, Yokohama (JP);
Tomohiko Koto, Yokohama (JP);
Masahisa Iida, Yokohama (JP)

(73) Assignee: Socionext Inc., Kanagawa (JP)

( * ) Notice: Subject to any disclaimer, the term of this
patent is extended or adjusted under 35
U.S.C. 154(b) by 16 days.

(21) Appl. No.: 18/627,023

(22) Filed: Apr. 4, 2024

(65) Prior Publication Data

US 2024/0250676 A1 Jul. 25, 2024

Related U.S. Application Data

(63) Continuation of application No.
PCT/JP2021/037842, filed on Oct. 13, 2021.

(51) Int. Cl.
*H03K 17/00* (2006.01)
*H03K 17/041* (2006.01)
*H03K 19/0185* (2006.01)

(52) U.S. Cl.
CPC ................. *H03K 17/04106* (2013.01); *H03K
19/018507* (2013.01)

(58) Field of Classification Search
CPC ........... H03K 19/0175; H03K 19/0185; H03K
19/018507; H03K 19/018585
See application file for complete search history.

(56) References Cited

U.S. PATENT DOCUMENTS 5,973,534 A * 10/1999 Singh ................... H03K 17/102
327/309

6,130,557 A * 10/2000 Drapkin ........... H03K 19/00315
326/83
6,714,048 B1 * 3/2004 Sharpe-Geisler ..........................
H03K 19/018585
326/62
9,614,529 B1 * 4/2017 Chen .............. H03K 19/018507
11,646,737 B1 * 5/2023 Chan ................ H03K 19/00361
327/333
2015/0171866 A1 * 6/2015 Ilgenstein ................ G11C 8/08
327/333

(Continued)

FOREIGN PATENT DOCUMENTS

JP 2013-090278 A 5/2013
WO 2017/098909 A1 6/2017

OTHER PUBLICATIONS

International Search Report dated Jan. 18, 2022 issued in International Patent Application No. PCT/JP2021/037842, with partial English translation.

(Continued)

*Primary Examiner* — Tuan T Lam
(74) *Attorney, Agent, or Firm* — Rimon P.C.

(57) ABSTRACT

An output circuit outputs an output signal having an amplitude VCCH responsive to an input signal having an amplitude VCCL. The output circuit includes: first and second p-type transistors connected in series between VCCH and an output terminal; a first n-type transistor grounded at its source and receiving a first signal at its gate; a third p-type transistor connected to VCCH at its source, connected to the gate of the first p-type transistor at its drain, and receiving a second signal at its gate; and a first diode connected between the drains of the first n-type transistor and the third p-type transistor.

2 Claims, 16 Drawing Sheets

(56) References Cited

U.S. PATENT DOCUMENTS

2018/0287600 A1    10/2018  Iida et al.
2019/0386653 A1*  12/2019  Iida .................... H03K 19/0175
2020/0042029 A1*   2/2020  Shimizu ........... H03K 19/00361

OTHER PUBLICATIONS

Written Opinion of the International Searching Authority dated Jan. 18, 2022 issued in International Patent Application No. PCT/JP2021/037842, with partial English translation.

\* cited by examiner

22

NH

SIGNAL
AMPLITUDE:
VCCL~VCCH

PN

SIGNAL
AMPLITUDE:
VCCL~VCCH

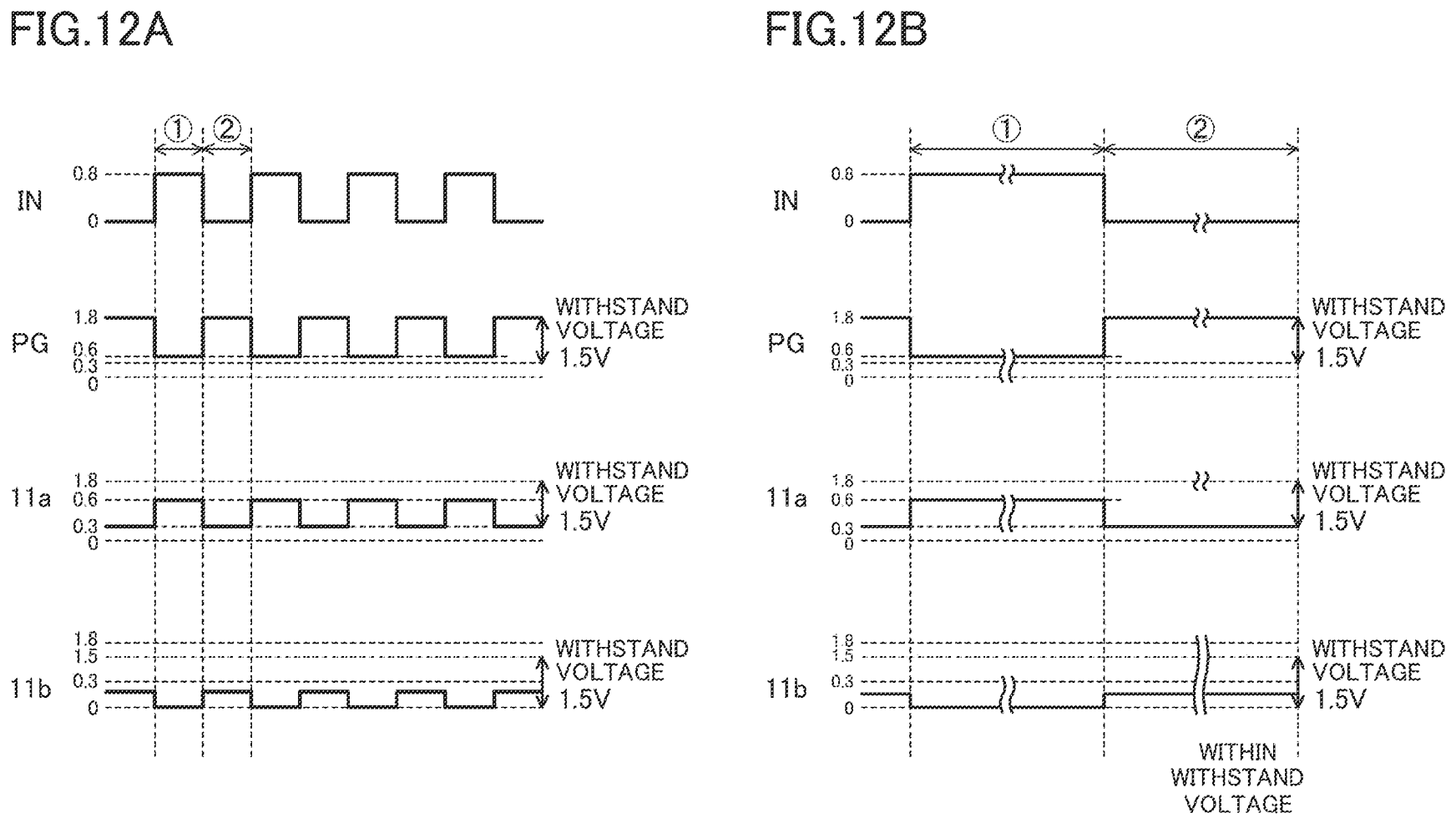

| | | ① | ② | |

IN
0.8
0

PG
1.8
0.6
0.3
0
WITHSTAND VOLTAGE 1.5V 11a
1.8
0.6
0.3
0
WITHSTAND VOLTAGE 1.5V 11b
1.8
1.5
0.3
0
WITHSTAND VOLTAGE 1.5V

WITHIN WITHSTAND VOLTAGE

FIG.12A

| ① | ② |

IN
0.8
0

PG
1.8
0.6
0.3
0
WITHSTAND VOLTAGE 1.5V 11a
1.8
0.6
0.3
0
WITHSTAND VOLTAGE 1.5V 11b
1.8
1.5
0.3
0
WITHSTAND VOLTAGE 1.5V

OUTPUT CIRCUIT

CROSS-REFERENCE TO RELATED APPLICATIONS

This is a continuation of International Application No. PCT/JP2021/037842 filed on Oct. 13, 2021. The entire disclosure of this application is incorporated by reference herein.

BACKGROUND

The present disclosure relates to a high-voltage output circuit using low-withstand voltage transistors.

With the recent scaling of semiconductor processes, the internal power supply voltages of semiconductor integrated circuits are becoming lower, and the operations of semiconductor integrated circuits are being sped up. Also, transistor withstand voltages are becoming increasingly lower. On the other hand, some of various interfaces require a high voltage due to their specifications. In view of this, a high-voltage output circuit using low-withstand voltage transistors has become necessary.

In order to form a high-voltage output circuit using low-withstand voltage transistors, it has been conventionally done to distribute a voltage to be applied to transistors using configurations such as one of cascading low-withstand voltage transistors and one of inserting multiple stages of diodes.

Japanese Unexamined Patent Publication No. 2013-90278 discloses an output circuit outputting a high-voltage signal, which uses low-withstand voltage transistors. This output circuit is configured so as to avoid direct application of a high voltage across the gate-source/drain and source-drain of a low-withstand voltage transistor.

However, the output circuit disclosed in the cited patent document has the following problems. Since there are a rise in the low level of the output signal and an occurrence of an unwanted current between power supply and ground, the reliability is low. Also, since sufficient drive capability cannot be obtained from low-withstand voltage transistors, the circuit is not suitable for high-speed operation.

An objective of the present disclosure is implementing a highly-reliable output circuit suitable for high-speed operation using low-withstand voltage transistors.

SUMMARY

According to the first mode of the present disclosure, an output circuit for outputting an output signal responsive to an input signal having an amplitude corresponding to a first power supply voltage from an output terminal, the output signal having an amplitude corresponding to a second power supply voltage greater than the first power supply voltage, includes: first and second p-type transistors connected in series between a second power supply supplying the second power supply voltage and the output terminal; a first n-type transistor grounded at its source and receiving a first signal responsive to the input signal at its gate, the first signal having an amplitude from a ground voltage to a first predetermined voltage; a third p-type transistor connected to the second power supply at its source, connected to a gate of the first p-type transistor at its drain, and receiving a second signal responsive to the input signal at its gate, the second signal having an amplitude from the first predetermined voltage to the second power supply voltage; and a first diode including one diode or a plurality of serially connected diodes, connected between the drain of the third p-type transistor and a drain of the first n-type transistor.

According to the above mode, when the input signal is in a low level, the second signal responsive to the input signal becomes a first predetermined voltage. The third p-type transistor, connected to the second power supply at its source and receiving the first predetermined voltage at its gate, turns on under the condition of (second power supply voltage—first predetermined voltage) being greater than the threshold voltage, and its drain becomes the second power supply voltage. Since the first p-type transistor, of which the gate is connected to the drain of the third p-type transistor, receives the second power supply voltage at its gate, it fully turns off. It is therefore possible to avoid a rise in the low level of the output signal and an occurrence of an unwanted current between power supply and ground, and thus a highly-reliable output circuit can be implemented.

According to the second mode of the present disclosure, an output circuit for outputting an output signal responsive to an input signal having an amplitude corresponding to a first power supply voltage from an output terminal, the output signal having an amplitude corresponding to a second power supply voltage greater than the first power supply voltage, includes: first and second p-type transistors connected in series between a second power supply supplying the second power supply voltage and the output terminal; first and second n-type transistors connected in series between a ground terminal and the output terminal; a first circuit receiving a first signal responsive to the input signal, the first signal having an amplitude from a ground voltage to a first predetermined voltage, the first circuit giving a signal to a gate of the second p-type transistor; and a second circuit receiving a second signal responsive to the input signal, the second signal having an amplitude from the first predetermined voltage to the second power supply voltage, the second circuit giving a signal to a gate of the second n-type transistor.

According to the above mode, while the gate of the second p-type transistor is controlled with the signal output from the first circuit, the gate of the second n-type transistor is controlled with the signal output from the second circuit. It is therefore possible to adjust the signals given to the gates of the second p-type transistor and the second n-type transistor independently so that the operations of these transistors be individually optimum. With this, since the drive capability of the second p-type transistor and the second n-type transistor can be sufficiently exploited, an output circuit suitable for high-speed operation can be implemented.

According to the third mode of the present disclosure, an output circuit for outputting an output signal responsive to an input signal having an amplitude corresponding to a first power supply voltage from an output terminal, the output signal having an amplitude corresponding to a second power supply voltage greater than the first power supply voltage, includes: first and second n-type transistors connected in series between a ground terminal and the output terminal; a third n-type transistor grounded at its source, connected to a gate of the first n-type transistor at its drain, and receiving a first signal responsive to the input signal at its gate, the first signal having an amplitude from a ground voltage to a first predetermined voltage; a first p-type transistor connected to a second power supply supplying the second power supply voltage at its source, and receiving a second signal responsive to the input signal at its gate, the second signal having an amplitude from the first predetermined voltage to the second power supply voltage; and a first diode including one diode or a plurality of serially connected diodes, connected between a drain of the first p-type transistor and the drain of the third n-type transistor.

According to the above mode, when the input signal is in a low level, the second signal responsive to the input signal becomes a first predetermined voltage. The first p-type transistor, connected to the second power supply at its source and receiving the first predetermined voltage at its gate, turns on under the condition of (second power supply voltage—first predetermined voltage) being greater than the threshold voltage, and its drain becomes the second power supply voltage. Since the gate of the first n-type transistor is connected to the drain of the third n-type transistor, it receives a voltage reduced from the second power supply voltage by a forward voltage of the first diode. With this, since the gate-source voltage of the first n-type transistor can be sufficiently made high, the drive capability can be sufficiently exploited. Therefore, an output circuit suitable for high-speed operation can be implemented.

According to the present disclosure, a highly-reliable output circuit suitable for high-speed operation can be implemented using low-withstand voltage transistors.

BRIEF DESCRIPTION OF THE DRAWINGS

FIG. 11A is a waveform diagram showing the operation of a circuit 11 in the first embodiment, and FIG. 11B is a waveform diagram in a steady state.

FIG. 12A is a waveform diagram showing the operation of a circuit 11B in the third embodiment, and FIG. 12B is a waveform diagram in a steady state.

DETAILED DESCRIPTION

Embodiments of the present disclosure will be described hereinafter with reference to the accompanying drawings.

Note that, in the following description, "VCCL" and "VCCH" denote power supply voltages or power supplies themselves, and "GND" denotes a ground voltage or a ground terminal. The power supply voltage VCCH is greater than the power supply voltage VCCL. Also, "H" and "L" represent the logic levels of a signal, where "H" represents a high level and "L" a low level. "Z" denotes an output terminal or output signal of an output circuit.

Also, in the following description, MOS transistors are used as an example of transistors. The threshold voltage of a p-type MOS transistor (abbreviated as a PMOS appropriately) is denoted by Vthp, and the gate-source voltage thereof is denoted by Vgsp. The threshold voltage of an n-type MOS transistor (abbreviated as an NMOS appropriately) is denoted by Vthn, and the gate-source voltage thereof is denoted by Vgsn. The forward voltage of a diode is denoted by Vf.

Note that "P" is used as the character of a PMOS, "N" is used as the character of an NMOS, and "D**" is used as the character of a diode (* is a numeric). Also, to avoid complication of description, expression of a PMOS, an NMOS, and a diode may be simplified, such as "a PMOS P" being simplified as "P", for example.

First Embodiment

Figure 1:
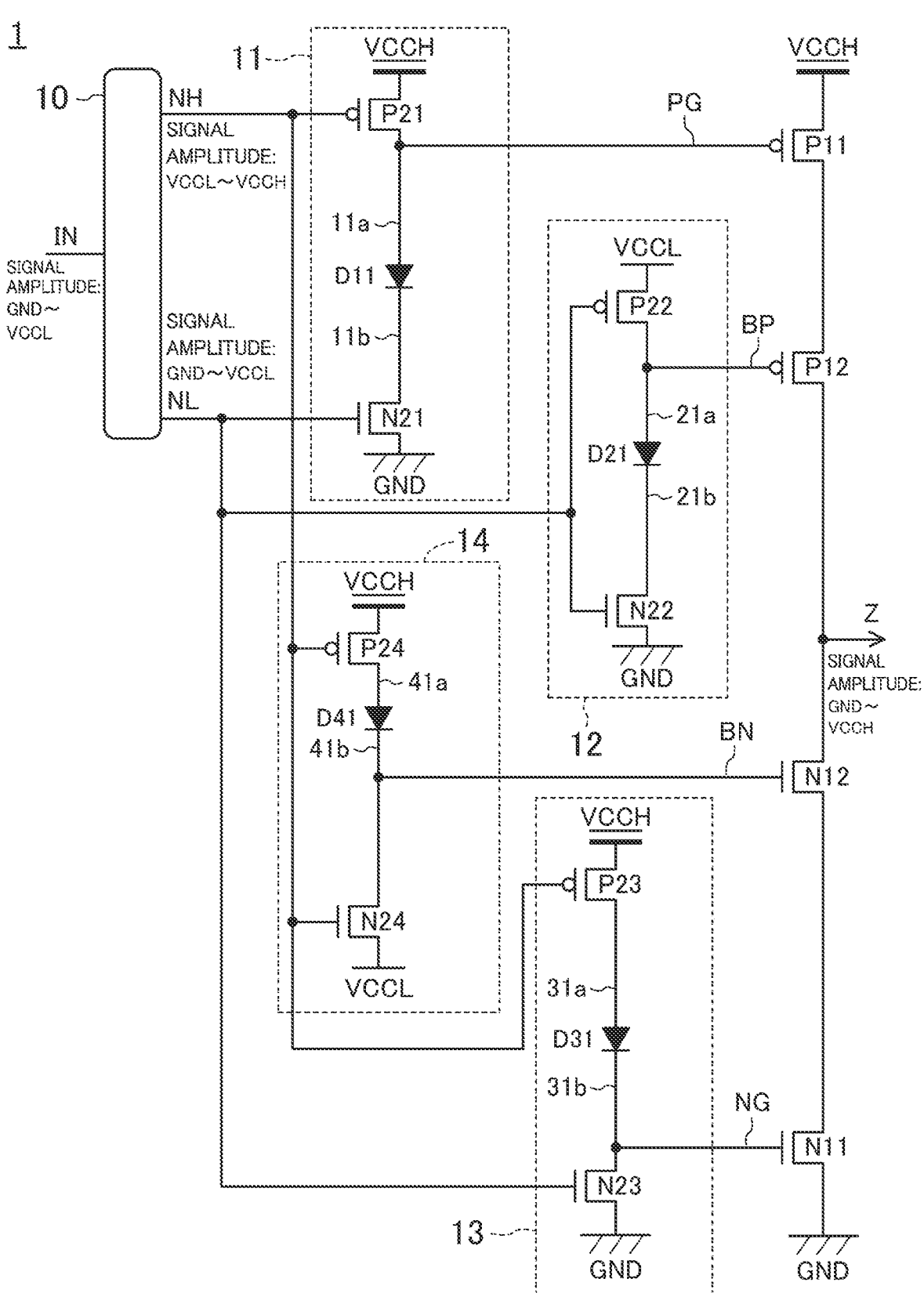
FIG. 1 shows a circuit configuration of an output circuit according to the first embodiment.

FIG. 1 is a circuit diagram showing a circuit configuration of an output circuit according to the first embodiment. An output circuit 1 shown in FIG. 1 outputs an output signal Z having an amplitude VCCH responsive to an input signal IN having an amplitude VCCL. The input signal IN having the amplitude VCCL is a signal that becomes GND when it is L and VCCL when it is H. The output signal Z having the amplitude VCCH is a signal that becomes GND when it is L and VCCH when it is H.

As shown in FIG. 1, the output circuit 1 includes PMOSs P11 and P12 connected in series between the power supply VCCH and the output terminal Z and NMOSs N11 and N12 connected in series between the ground terminal GND and the output terminal Z. The output circuit 1 also includes: a circuit 11 that outputs a signal PG given to the gate of P11; a circuit 12 that outputs a signal BP given to the gate of P12; a circuit 13 that outputs a signal NG given to the gate of N11; and a circuit 14 that outputs a signal BN given to the gate of N12. The output circuit 1 further includes a signal conversion circuit 10 that converts the input signal IN into signals NH and NL responsive to the input signal IN. The signal NH is a signal having an amplitude of VCCL to VCCH, i.e., a signal becoming VCCL when it is L and VCCH when it is H. The signal NL is a signal having an amplitude of GND to VCCL, i.e., a signal becoming GND when it is L and VCCL when it is H.

Note that the voltage when the signal NH is L and the voltage when the signal NL is H are not necessarily the same, i.e., VCCL. It is however preferred that the voltage when the signal NH is L and the voltage when the signal NL is H be the same.

The circuit 11 includes a PMOS P21, a diode D11, and an NMOS N21 placed in series between the power supply VCCH and the ground terminal GND. P21 is connected to VCCH at its source, receives the signal NH at its gate, and is connected to the anode of D11 at its drain. N21 is connected to GND at its source, receives the signal NL at its gate, and is connected to the cathode of D11 at its drain. The drain of P21 is connected to the gate of P11, to give the signal PG.

The circuit 12 includes a PMOS P22, a diode D21, and an NMOS N22 placed in series between the power supply VCCL and the ground terminal GND. P22 is connected to VCCL at its source, receives the signal NL at its gate, and is connected to the anode of D21 at its drain. N22 is connected to GND at its source, receives the signal NL at its gate, and is connected to the cathode of D21 at its drain. The drain of P22 is connected to the gate of P12, to give the signal BP.

The circuit 13 includes a PMOS P23, a diode D31, and an NMOS N23 placed in series between the power supply VCCH and the ground terminal GND. P23 is connected to VCCH at its source, receives the signal NH at its gate, and is connected to the anode of D31 at its drain. N23 is connected to GND at its source, receives the signal NL at its gate, and is connected to the cathode of D31 at its drain. The drain of N23 is connected to the gate of N11, to give the signal NG.

The circuit 14 includes a PMOS P24, a diode D41, and an NMOS N24 placed in series between the power supply VCCH and the power supply VCCL. P24 is connected to VCCH at its source, receives the signal NH at its gate, and is connected to the anode of D41 at its drain. N24 is connected to VCCL at its source, receives the signal NH at its gate, and is connected to the cathode of D41 at its drain. The drain of N24 is connected to the gate of N12, to give the signal BN.

Note that, while the diodes D11, D21, D31, and D41 are each illustrated as having one diode element, they may have a plurality of diode elements connected in series. The number of serially connected diode elements may be determined appropriately depending on the value of the power supply voltage and the value of the transistor withstand voltage.

Note also that, as the diodes D11, D21, D31, and D41, a self-biased transistor of which the gate is connected to its drain may be used in place of the diode element. A p-type or n-type transistor can be used in this case.

Figure 2:
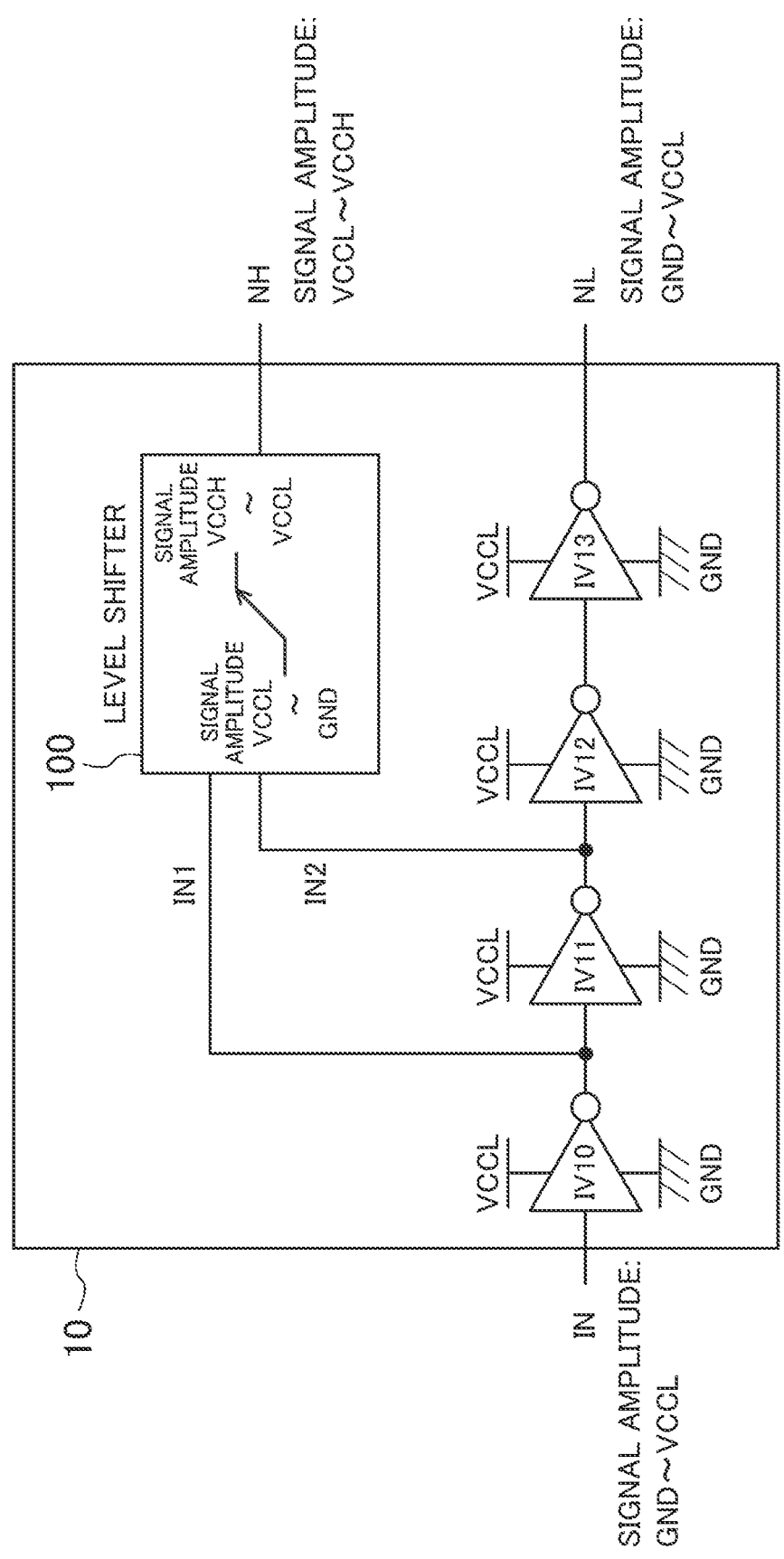
FIG. 2 shows a circuit configuration of a signal conversion circuit in the output circuit of FIG. 1.

FIG. 2 shows a circuit configuration of the signal conversion circuit 10. As shown in FIG. 2, the signal conversion circuit 10 includes four inverters IV10, IV11, IV12, and IV13 connected in series and a level shifter 100. The inverters IV10, IV11, IV12, and IV13 are constituted by low-withstand voltage transistors. The input signal IN is given to the input of the inverter IV10, and the signal NL is output from the output of the inverter IV13. When the input signal IN is L (GND), the signal NL becomes L (GND), and when the input signal IN is H (VCCL), the signal NL becomes H (VCCL). The level shifter 100 receives an output IN1 of the inverter IV10 and an output IN2 of the inverter IV11 as its inputs, and outputs the signal NH. When the input signal IN is L (GND), the signal NH becomes L (VCCL), and when the input signal IN is H (VCCL), the signal NH becomes H (VCCH).

Figure 3:
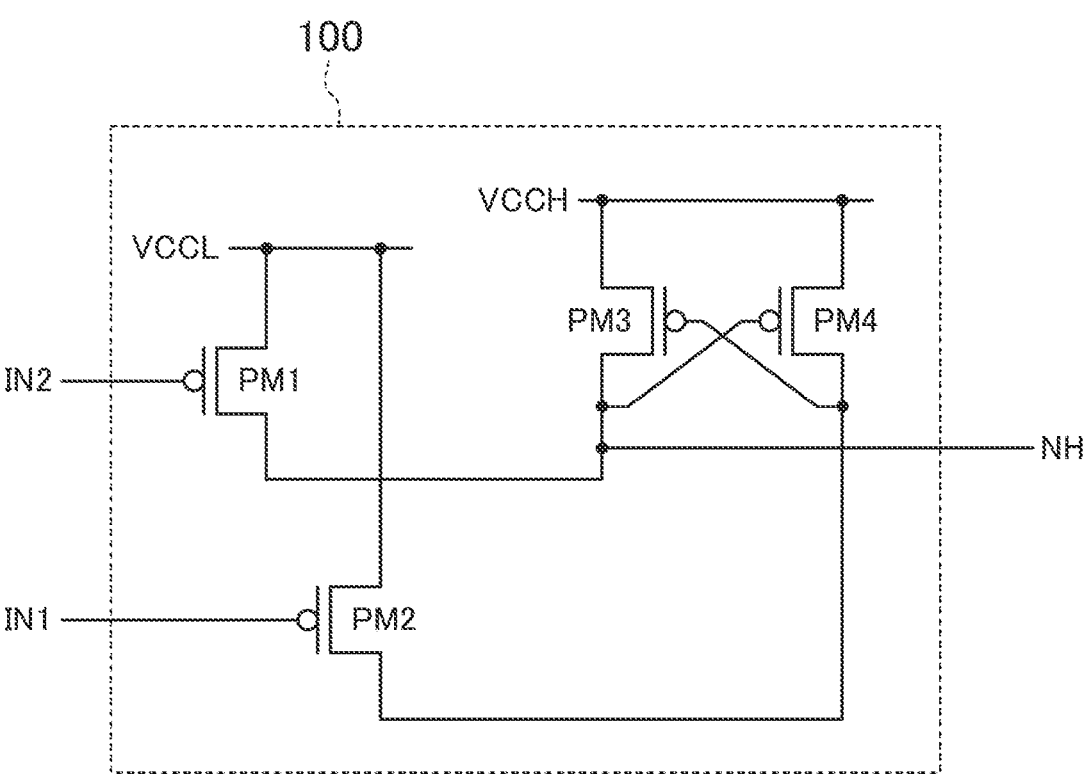
FIG. 3 shows a circuit configuration of a level shifter in the signal conversion circuit of FIG. 2.

FIG. 3 shows a circuit configuration of the level shifter 100. As shown in FIG. 3, the level shifter 100 includes four PMOSs PM1, PM2, PM3, and PM4. The sources of PM1 and PM2 are connected to the power supply VCCL, and the sources of PM3 and PM4 are connected to the power supply VCCH. The output IN2 of the inverter IV11 is given to the gate of PM1, and the output IN1 of the inverter IV10 is given to the gate of PM2. The gate of PM3 is connected to the drains of PM2 and PM4. The gate of PM4 is connected to the drains of PM1 and PM3, and serves as the output node of the signal NH.

Note that the circuit configuration of the signal conversion circuit 10 is not limited to that shown in FIGS. 2 and 3. Any other configuration may be used if only the signal NL becomes L (GND) and the signal NH becomes L (VCCL) when the input signal IN is L (GND), and the signal NL becomes H (VCCL) and the signal NH becomes H (VCCH) when the input signal IN is H (VCCL).

<Contrast Example>

Figure 16:
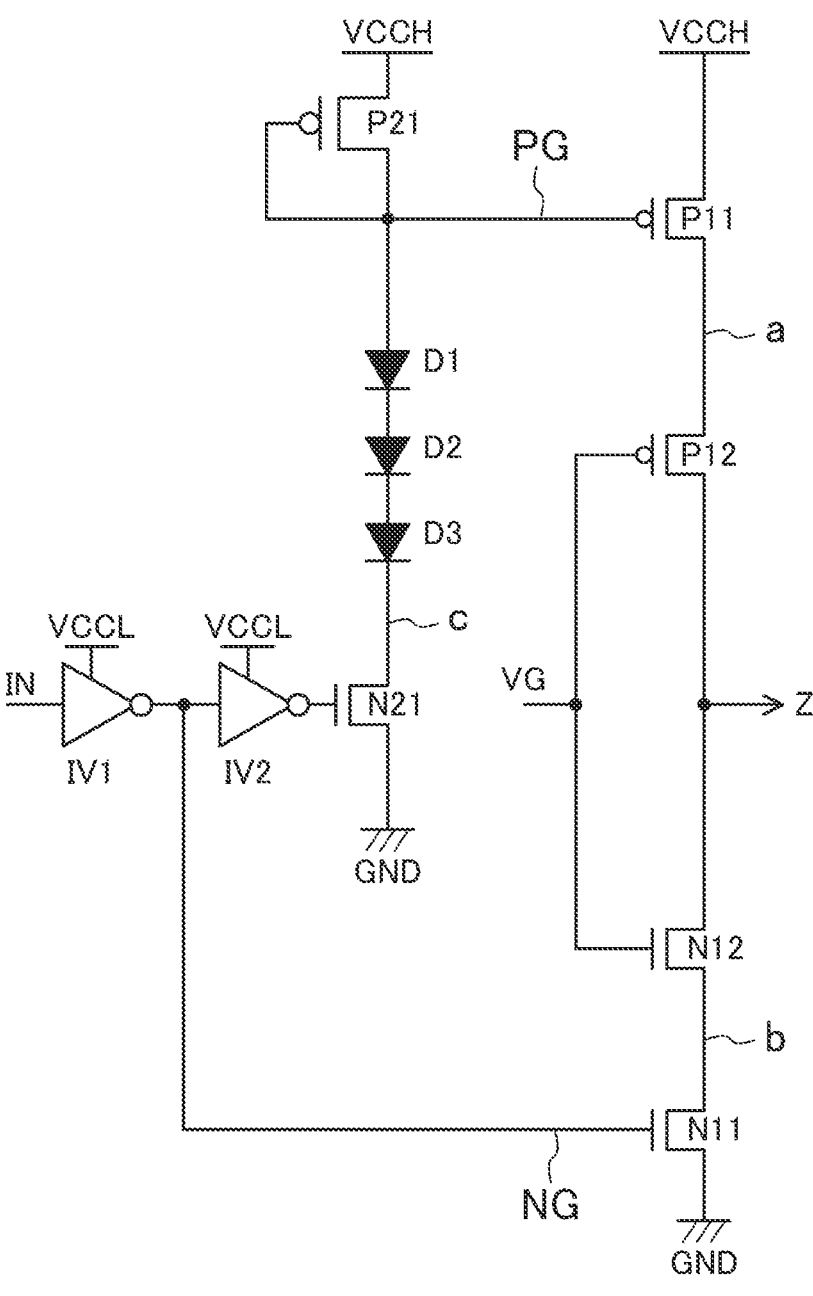
FIG. 16 shows a circuit configuration of an output circuit of a contrast example.

FIG. 16 shows a circuit configuration of an output circuit disclosed in the cited patent document as a contrast example. The output circuit shown in FIG. 16, like the output circuit 1 described above, outputs an output signal Z having an amplitude VCCH responsive to an input signal IN having an amplitude VCCL.

The output circuit of the contrast example shown in FIG. 16 has the following problems.

(1) When the input signal IN=L, the output signal Z is expected to be L (GND). However, in the output circuit of FIG. 16, since PG=VCCH−|Vthp| when IN=L, P11 fails to be completely turned off. Therefore, a rise in the low level of the output signal Z occurs, and if this rise exceeds input level specifications of a circuit that receives the output signal Z, a communication error will occur. Also, because of P11 failing to become completely off, an unwanted current occurs in the path of VCCH→P11→P12→N12→N11→GND. This hastens the deterioration of transistors and wires, causing decrease in reliability.

(2) In the output circuit of FIG. 16, the same signal VG is given to the gates of P12 and N12. Therefore, since sufficient drive capability cannot be obtained by combining the withstand voltage value of a low-withstand voltage transistor and the voltage value of VCCH, the circuit is not suitable for high-speed operation.

For example, assume that VCCH=1.8 V and the withstand voltage value of the transistors is 1.5 V. When IN=H and Z=H, P11 is turned on, whereby a node a becomes VCCH. Therefore, $$|Vgsp12| = 1.8 - VG$$

where Vgsp12 is the gate-source voltage of P12. Also, when IN=L and Z=L, N11 is turned on, whereby a node b becomes GND. Therefore, $$|Vgsn12| = VG - 0$$

where Vgsn12 is the gate-source voltage of N12. In general, the current capability of a transistor is higher as its gate-source voltage is higher. It is therefore preferable to set the voltage of the signal VG so that both |Vgsp12| and |Vgsn12| be maximum. To do so, the signal VG=0.9 V is preferable, where $$|Vgsn12| = |Vgsn12| = 0.9 \text{ V}.$$

As a result, the transistors P12 and N12, to which 1.5 V can be applied as the gate-source voltage, are to be driven with application of 0.9 V, indicating that sufficient drive capability cannot be obtained from P12 and N12.

(3) In the output circuit of FIG. 16, the output of an inverter IV1 operating with VCCL is given to the gate of N11 as the signal NG. Therefore, a sufficient drive capability may not be obtained from N11 depending on the value of VCCL.

For example, assume that VCCL=0.8 V, VCCH=1.8 V, and the withstand voltage value of the transistor is 1.5 V. When IN=L and Z=L, the output of the inverter IV1, i.e., the signal NG becomes VCCL (0.8 V), and therefore, $$|Vgsn11| = 0.8 \text{ V}$$

where Vgsn11 is the gate-source voltage of N11.

As a result, the transistor N11, to which 1.5 V can be applied as the gate-source voltage, is to be driven with application of 0.8 V, indicating that sufficient drive capability cannot be obtained from N11.

Operation of Output Circuit of First Embodiment

Figure 4:
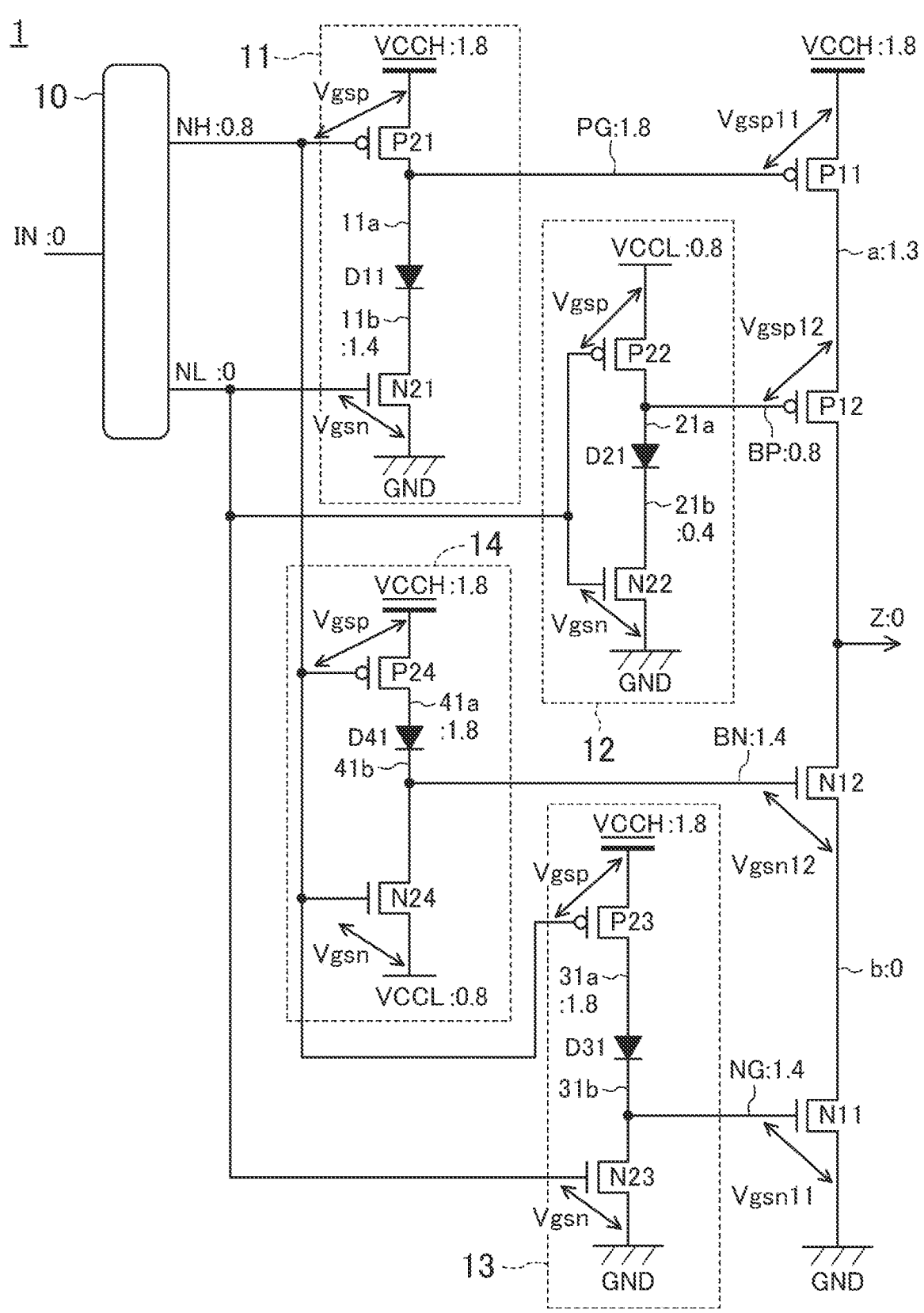
FIG. 4 is a view showing an operation of the output circuit of FIG. 1.

The operation of the output circuit 1 of the first embodiment will be described. As an example, assume the following.

$$VCCL = 0.8 \text{ V}$$

$$VCCH = 1.8 \text{ V}$$

withstand voltage value of transistor=1.5 V
threshold voltage of transistor |Vthp|=|Vthn|=0.5 V
forward voltage of diode Vf=0.4 V (1) When IN=L FIG. 4 shows potentials of nodes in the output circuit 1 of FIG. 1 when IN=L (GND=0 V). The signal conversion circuit 10 outputs L (0.8 V) as the signal NH and L (0 V) as the signal NL.

At this time, P21, P22, P23, and P24 are all turned on since $$|Vgsp| > |Vthp| = 0.5 \text{ V}.$$

Also, N21, N22, N23, and N24 are all turned off since $$|Vgsn| < |Vthn| = 0.5 \text{ V}.$$

Since P21 is turned on, the signal PG output from the circuit 11 becomes VCCH (1.8 V). Therefore, the gate-source voltage |Vgsp11| of P11 becomes 0 V, whereby P11 can be completely turned off. Also, at this time, in the circuit 11, the potential of a cathode 11b of D11 becomes 1.4 V, reduced from the potential of the signal PG by Vf (0.4 V) of D11.

The signal BP is output from the circuit 12 and the signal BN is output from the circuit 14. That is, the signal BP and the signal BN can be controlled independently. Since P22 is turned on, the signal BP output from the circuit 12 becomes VCCL (0.8 V). At this time, in the circuit 12, the potential of a cathode 21b of D21 becomes 0.4 V, reduced from the potential of the signal BP by Vf (0.4 V) of D21. Since P24 is turned on, the signal BN output from the circuit 14 becomes 1.4 V, reduced from VCCH (1.8 V) by Vf (0.4 V) of D41. Therefore, compared with the contrast example, the gate-source voltage |Vgsn12| of N12 can be made high, which is suitable for high-speed operation.

Since P23 is turned on, the signal NG output from the circuit 13 becomes 1.4 V, reduced from VCCH (1.8 V) by Vf (0.4 V) of D31. Therefore, compared with the contrast example, the gate-source voltage |Vgsn11| of N11 can be made high, which is suitable for high-speed operation.

N11 is turned on, making the potential of the node b 0 V, and N12 is turned on, whereby Z=L (0 V). The potential of the node a becomes a value obtained by adding |Vthp| (0.5 V) to the potential (0.8 V) of the signal BP, i.e., 1.3 V.

As a result of the operation as described above, the gate-source/drain voltages and source-drain voltages of all the transistors fall within the withstand voltage value (1.5 V).

(2) When IN=H

Figure 5:
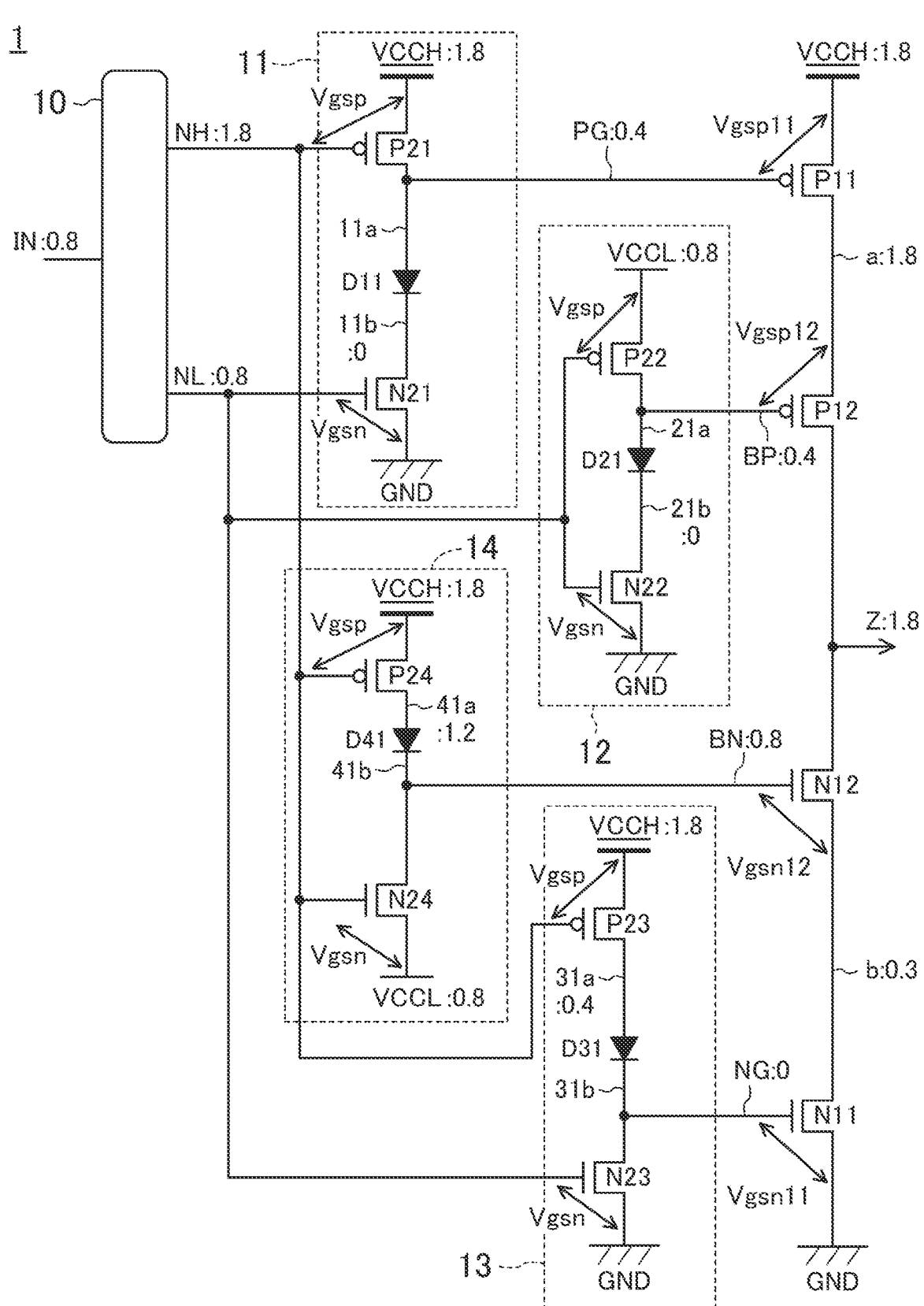
FIG. 5 is a view showing an operation of the output circuit of FIG. 1.

FIG. 5 shows potentials of nodes in the output circuit 1 of FIG. 1 when IN=H (VCCL=0.8 V). The signal conversion circuit 10 outputs H (1.8 V) as the signal NH and H (0.8 V) as the signal NL.

At this time, P21, P22, P23, and P24 are all turned off since $$|Vgsp| < |Vthp| = 0.5 \text{ V}.$$

Also, N21, N22, N23, and N24 are all turned on since $$|Vgsn| > |Vthn| = 0.5 \text{ V}.$$

Since N21 is turned on, the signal PG output from the circuit 11 becomes 0.4 V, increased from GND (0 V) by Vf (0.4 V) of D11.

Since N22 is turned on, the signal BP output from the circuit 12 becomes 0.4 V, increased from GND (0 V) by Vf (0.4 V) of D21. Therefore, compared with the contrast example, the gate-source voltage |Vgsp12| of P12 can be made high, which is suitable for high-speed operation. Since N24 is turned on, the signal BN output from the circuit 14 becomes VCCL (0.8 V). At this time, in the circuit 14, the potential of an anode 41a of D41 becomes 1.2 V, increased from the potential of the signal BN by Vf (0.4 V) of D41.

Since N23 is turned on, the signal NG output from the circuit 13 becomes GND (0 V). Therefore, N11 is turned off since |Vgsn11|=0 V. Also, at this time, the potential of an anode 31a of D31 becomes 0.4 V, increased from the potential of the signal NG by Vf (0.4 V).

P11 is turned on, making the potential of the node a VCCH (1.8 V), and P12 is turned on, whereby Z=H (1.8 V). The potential of the node b becomes a value obtained by subtracting |Vthn| (0.5 V) from the potential (0.8 V) of the signal BN, i.e., 0.3 V.

As a result of the operation as described above, the gate-source/drain voltages and source-drain voltages of all the transistors fall within the withstand voltage value (1.5 V).

According to this embodiment, the problems of the contrast example described above can be solved.

Specifically, in the output circuit 1, by giving the signal NH to the gate of P21 in the circuit 11, P21 can be fully turned on. Since this can sufficiently increase the H level of the signal PG up to VCCH, P11 can be completely turned off. It is therefore possible to avoid a rise in the L level of the output signal Z and an occurrence of an unwanted current between VCCH and GND (problem (1) is solved).

In the output circuit 1, while the signal BP output from the circuit 12 is given to the gate of P12, the signal BN output from the circuit 14 is given to the gate of N12. With this, the signals BP and BN can be adjusted so that the operations of P12 and N12 become optimum individually. Therefore, since sufficient drive capability can be obtained from P12 and N12, the circuit is suitable for high-speed operation (problem (2) is solved).

In the output circuit 1, the signal NG output from the circuit 13 is given to the gate of N11, and the signal NG is generated independently of VCCL in the circuit 13. Therefore, when the input signal IN is L, the gate-source voltage of N11 can be made high, and thus the circuit is suitable for high-speed operation (problem (3) is solved).

Therefore, according to this embodiment, it is possible to implement, using low-withstand voltage transistors, the output circuit 1 that is high in reliability because there is neither a rise in the L level of the output signal Z nor an occurrence of an unwanted current between power supply and ground, and also suitable for high-speed operation because sufficient drive capability can be obtained from low-withstand voltage transistors.

Second Embodiment

Figure 6:
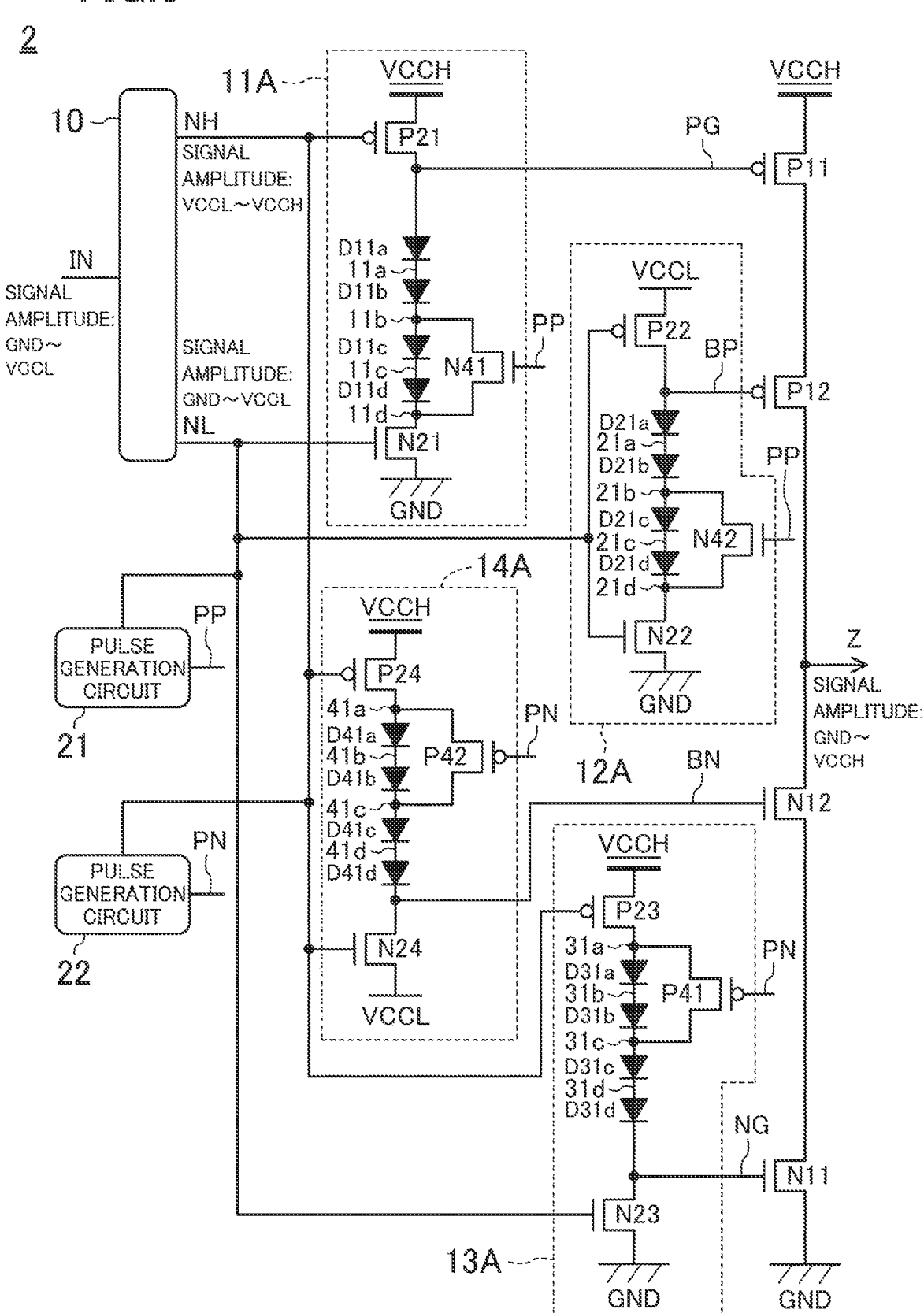
FIG. 6 shows a circuit configuration of an output circuit according to the second embodiment.

FIG. 6 is a circuit diagram showing a circuit configuration of an output circuit according to the second embodiment. Like the output circuit 1 of the first embodiment, an output circuit 2 shown in FIG. 6 outputs an output signal Z having an amplitude VCCH responsive to an input signal IN having an amplitude VCCL. The basic configuration of the output circuit 2 is similar to that of the output circuit 1. In the output circuit 2, circuits 11A, 12A, 13A, and 14A each having added components are provided in place of the circuits 11, 12, 13, and 14. Also, pulse generation circuits 21 and 22 are added.

In the circuit 11A, D11 in the circuit 11 is replaced with a plurality of (four in the figure) serially connected diodes D11a, D11b, D11c, and D11d, and an NMOS N41 is added. The source and drain of N41 are connected to a node 11b between D11b and D11c and to a node 11d between D11d and N21.

In the circuit 12A, D21 in the circuit 12 is replaced with a plurality of (four in the figure) serially connected diodes D21a, D21b, D21c, and D21d, and an NMOS N42 is added. The source and drain of N42 are connected to a node 21b between D21b and D21c and to a node 21d between D21d and N22.

In the circuit 13A, D31 in the circuit 13 is replaced with a plurality of (four in the figure) serially connected diodes D31a, D31b, D31c, and D31d, and a PMOS P41 is added. The source and drain of P41 are connected to a node 31a between P23 and D31a and to a node 31c between D31b and D31c.

In the circuit 14A, D41 in the circuit 14 is replaced with a plurality of (four in the figure) serially connected diodes D41a, D41b, D41c, and D41d, and a PMOS P42 is added. The source and drain of P42 are connected to a node 41a between P24 and D41a and to a node 41c between D41b and D41c.

The pulse generation circuit 21 generates, from the signal NL, a pulse signal PP to be given to the gates of N41 and N42. The pulse generation circuit 22 generates, from the signal NH, a pulse signal PN to be given to the gates of P41 and P42.

Figure 7A:
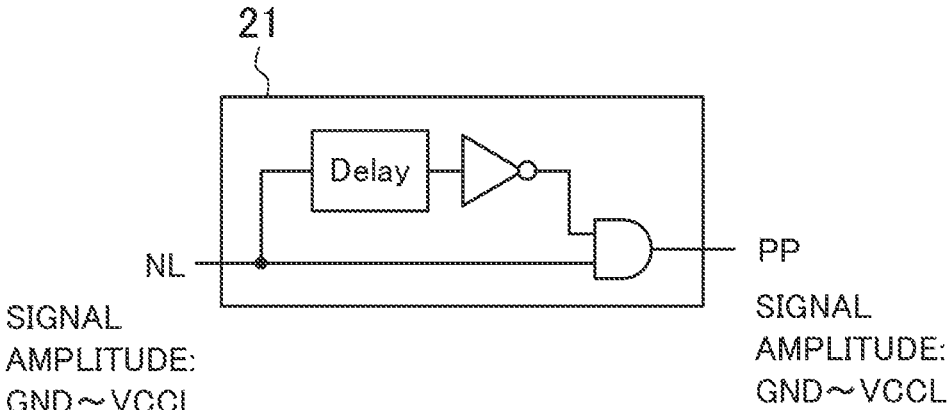
FIG. 7A shows a circuit configuration of a pulse generation circuit in the output circuit of FIG. 6.
Figure 7B:
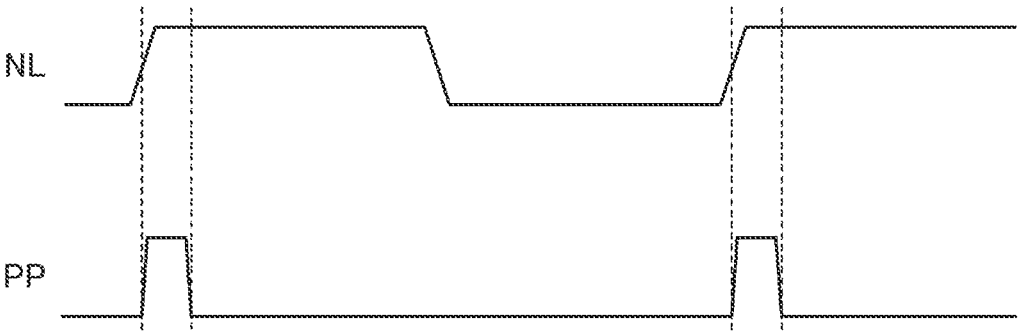
FIG. 7B is a waveform diagram of a pulse signal.

FIG. 7A shows a circuit configuration example of the pulse generation circuit 21, and FIG. 7B is a waveform diagram of the pulse signal PP. The amplitude of the pulse signal PP is the same as that of the signal NL, i.e., GND to VCCL. As shown in FIG. 7B, at a rising transition of the signal NL from L to H, the pulse signal PP generates a pulse, remains H for a predetermined time, and then makes a transition to L. At a falling transition of the signal NL from H to L, the pulse signal PP remains L.

Figure 8A:
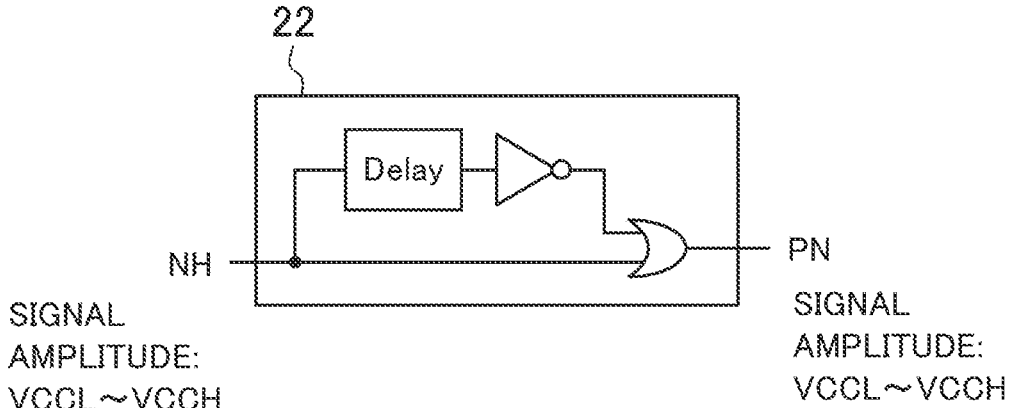
FIG. 8A shows a circuit configuration of a pulse generation circuit in the output circuit of FIG. 6.
Figure 8B:
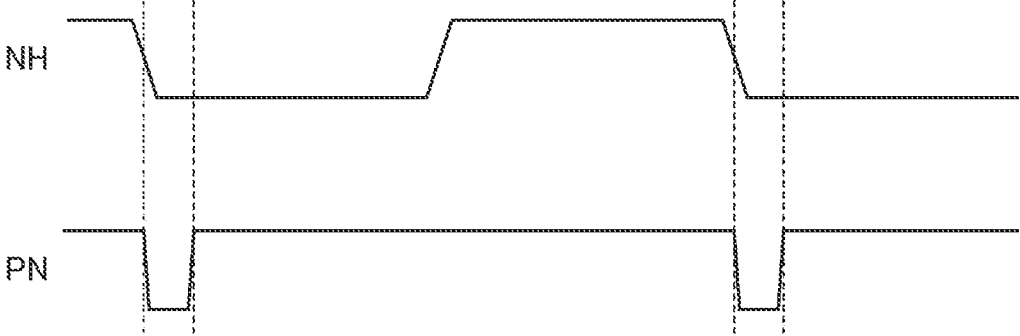
FIG. 8B is a waveform diagram of a pulse signal.

FIG. 8A shows a circuit configuration example of the pulse generation circuit 22, and FIG. 8B is a waveform diagram of the pulse signal PN. The amplitude of the pulse signal PN is the same as that of the signal NH, i.e., VCCL to VCCH. As shown in FIG. 8B, at a falling transition of the signal NH from H to L, the pulse signal PN generates a pulse, remains L for a predetermined time, and then makes a transition to H. At a rising transition of the signal NH from L to H, the pulse signal PN remains H.

Figures 9A, 9B:
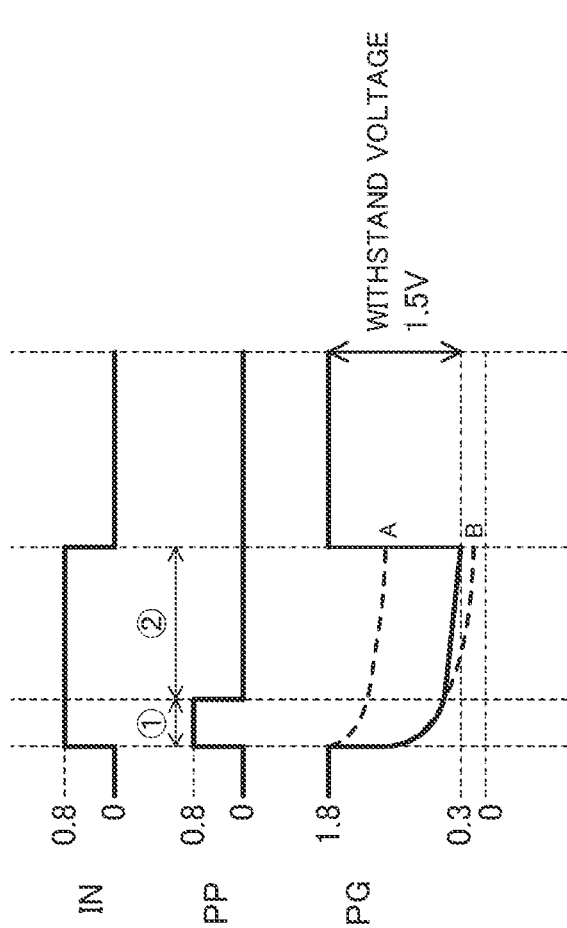
FIG. 9A shows a circuit configuration of a circuit 11A in the output circuit of FIG. 6.
FIG. 9B is a waveform diagram of a signal PG.

Features of the output circuit 2 will be described taking the operation of the circuit 11A as an example. FIG. 9A shows a circuit configuration of the circuit 11A, and FIG. 9B is a waveform diagram of the signal PG output from the circuit 11A. In this case, also, assume the following.

$$VCCL = 0.8 \ V$$

$$VCCH = 1.8 \ V$$

When the input signal IN makes a transition to H, the signals NH and NL make a transition to H accordingly. With the signal NL becoming H (0.8 V), N21 turns on. The pulse signal PP generates a pulse at a transition of the signal NL to H and remains H for a predetermined period. Since N41 is on during the period of the pulse signal PP being H, the node 11b and the node 11d are shorted, becoming the same potential. At this time, the number of diodes between P21 and N21 becomes substantially two, thereby increasing the per-diode potential difference exerted on D1a and D11b. In a diode, due to its static characteristics, as the anode-cathode potential difference is greater, the current flowing through increases. Therefore, during the period of N41 being on, the H to L transition of the signal PG is hastened.

In the waveform diagram of the signal PG shown in FIG. 9B, the broken line A shows a change to be exhibited if N41 is always off (four diodes), and the broken line B shows a change to be exhibited if N41 is always on (two diodes). The operation of falling of the signal PG is faster in the broken line B because the per-diode potential difference is greater. The signal PG changes like the broken line B during the period of the pulse signal PP being H (period (1)) and like the broken line A during the period of the pulse signal PP being back to L (period (2)). As a result, the signal PG changes as shown by the solid line, where the H to L transition is hastened.

As described above, in the circuit 11A, with the placement of the transistor N41, both ends of the series of D11c and D11d, out of the plurality of serially connected diodes, are shorted at a rising transition of the input signal IN, whereby the falling response of the signal PG can be hastened.

While, in the circuit configuration of FIG. 9A, both ends of the series of D11c and D11d, out of the plurality of serially connected diodes, are shorted through N41, the number of diodes to be shorted is not limited to two. For example, both ends of one diode may be shorted, or both ends of a series of three or more diodes may be shorted. Also, the positions of diodes to be shorted may be different from those in FIG. 9A. For example, in the circuit configuration of FIG. 9A, both ends of the series of D11*a* and D11*b* may be shorted, or both ends of the series of D11*b* and D11*c* may be shorted.

The circuits 12A, 13A, and 14A also operate similarly to the circuit 11A. That is, in the circuit 12A, when the signal NL becomes H, N22 turns on. Since N42 is on during the period of the pulse signal PP being H, the node 21*b* and the node 21*d* are shorted, becoming the same potential, whereby the H to L transition of the signal BP is hastened. In the circuit 13A, when the signal NH becomes L, P23 turns on. Since P41 is on during the period of the pulse signal PN being L, the node 31*a* and the node 31*c* are shorted, becoming the same potential, whereby the L to H transition of the signal NG is hastened. In the circuit 14A, when the signal NH becomes L, P24 turns on. Since P42 is on during the period of the pulse signal PN being L, the node 41*a* and the node 41*c* are shorted, becoming the same potential, whereby the L to H transition of the signal BN is hastened.

As described above, according to this embodiment, the falling response of the signals PG and BP given to the gates of P11 and P12 can be hastened, and also the rising response of the signals NG and BN given to the gates of N11 and N12 can be hastened. In this way, high-speed operation of the output circuit can be achieved.

Note that, in place of N41 of the circuit 11A and N42 of the circuit 12A, PMOSs may be provided. In this case, an inverted signal of the pulse signal PP may just be given to the gates of the PMOSs. Also, in place of P41 of the circuit 13A and P42 of the circuit 14A, NMOSs may be provided. In this case, an inverted signal of the pulse signal PN may just be given to the gates of the NMOSs.

Third Embodiment

Figure 10:
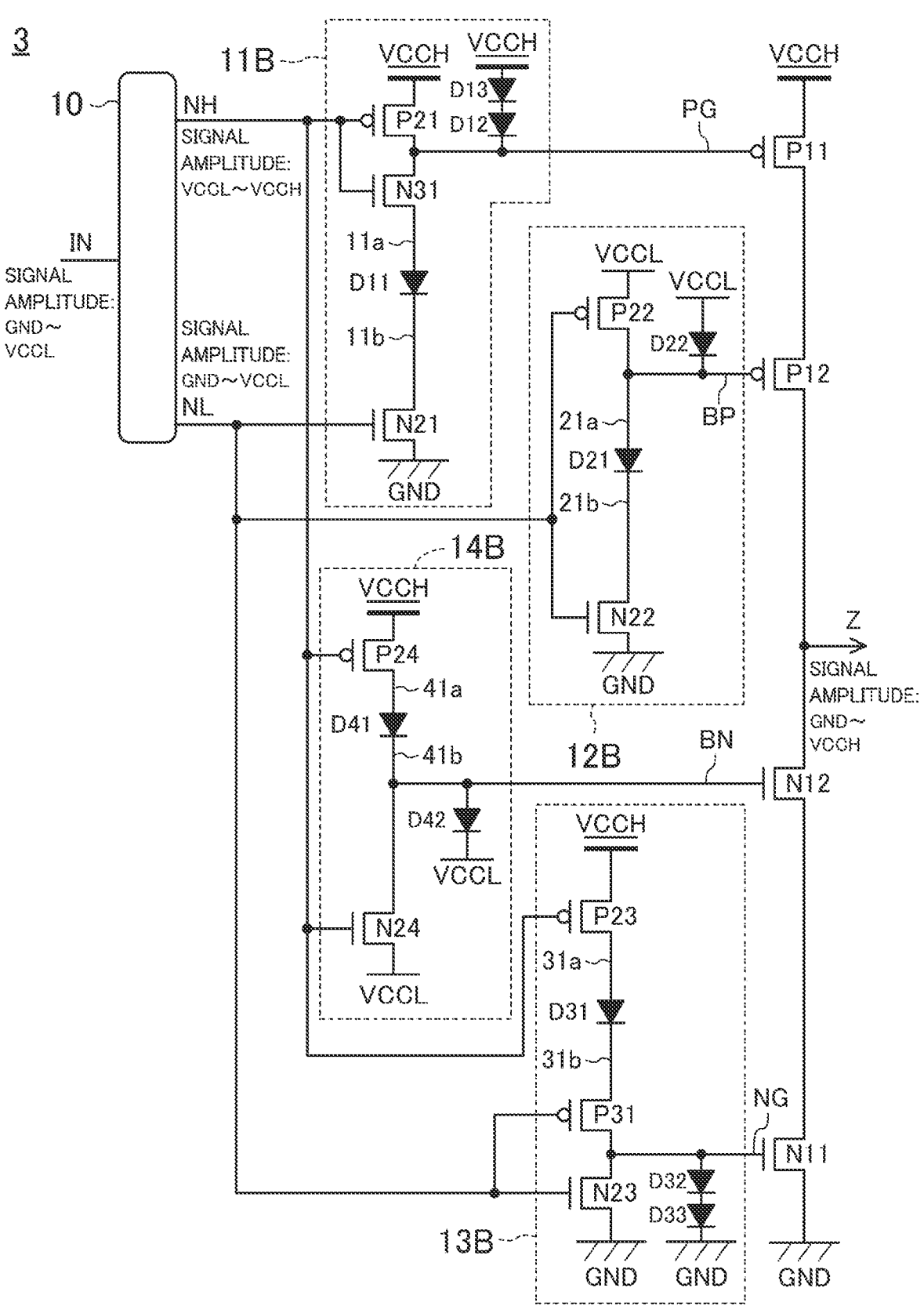
FIG. 10 shows a circuit configuration of an output circuit according to the third embodiment.

FIG. 10 is a circuit diagram showing a circuit configuration of an output circuit according to the third embodiment. Like the output circuit 1 of the first embodiment, an output circuit 3 shown in FIG. 10 outputs an output signal Z having an amplitude VCCH responsive to an input signal IN having an amplitude VCCL. The basic configuration of the output circuit 3 is similar to that of the output circuit 1. In the output circuit 3, circuits 11B, 12B, 13B, and 14B each having added components are provided in place of the circuits 11, 12, 13, and 14.

In the circuit 11B, serially connected diodes D12 and D13 are additionally provided between the power supply VCCH and the drain of P21. Also, an NMOS N31 is additionally provided between P21 and D11. The signal NH is given to the gate of N31.

In the circuit 12B, a diode D22 is additionally provided between the power supply VCCL and the drain of P22.

In the circuit 13B, serially connected diodes D32 and D33 are additionally provided between the ground terminal GND and the drain of N23. Also, a PMOS P31 is additionally provided between D31 and N23. The signal NL is given to the gate of P31.

In the circuit 14B, a diode D42 is additionally provided between the power supply VCCL and the drain of N24.

Features of the output circuit 3 will be described in comparison with the output circuit 1 of the first embodiment. As in the description of the first embodiment, assume the following.

$$VCCL = 0.8 \text{ V}$$

-continued $$VCCH = 1.8 \text{ V}$$

withstand voltage value of transistor=1.5 V $$|Vthp| = |Vthn| = 0.5 \text{ V}$$

$$Vf = 0.4 \text{ V}$$

Figures 11A, 11B:
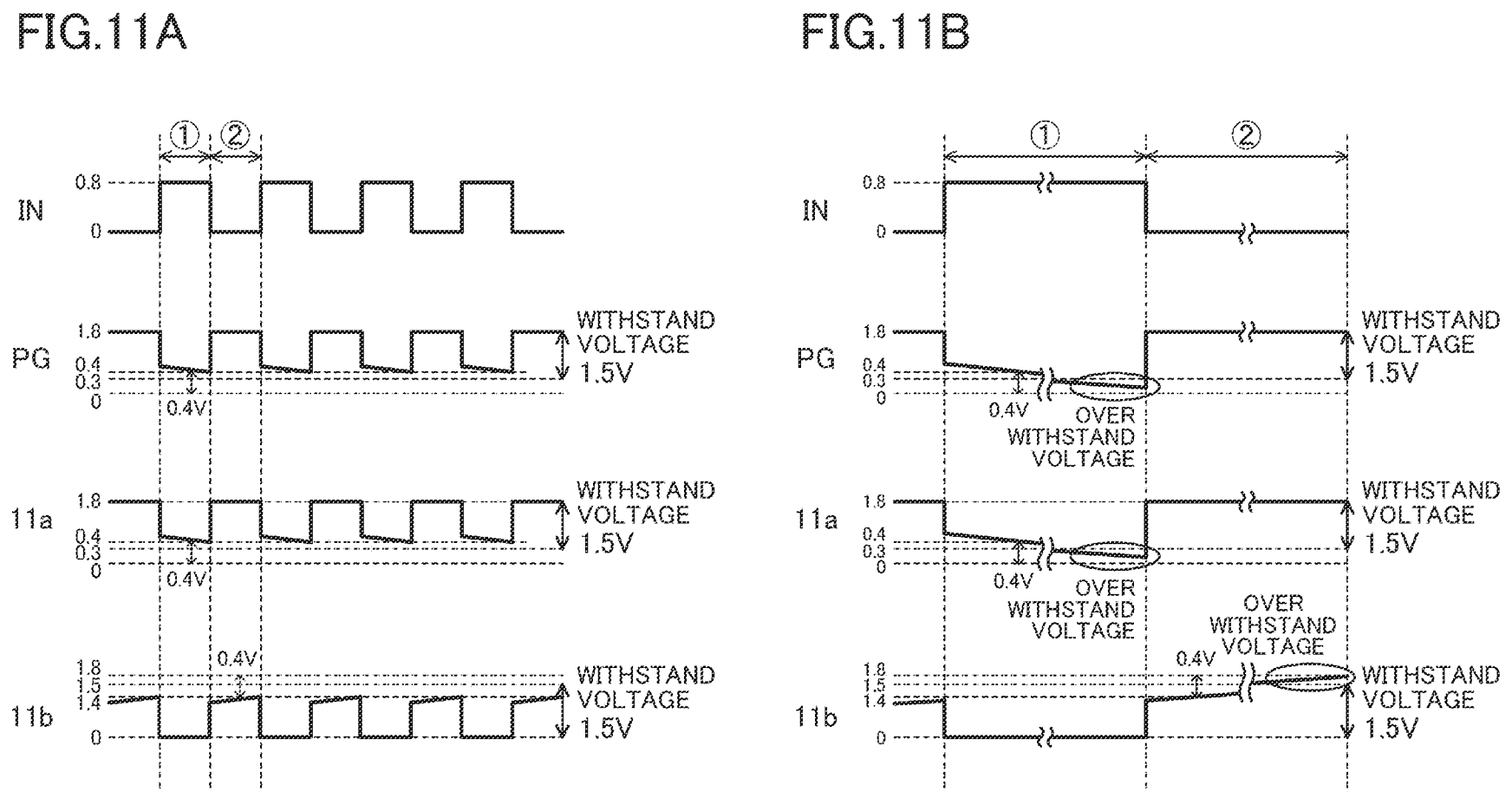

First, using FIGS. 11A-11B, the operation of the circuit 11 in the output circuit 1 of the first embodiment will be described. As shown in FIG. 11A, in the circuit 11, the potentials of the signal PG and a node 11*a* have the same waveform. During the period of the input signal IN being H (period (1)), since N21 is on, the potential of the signal PG becomes GND+Vf (0.4 V). During the period of the input signal IN being L (period (2)), since P21 is on, the potential of the signal PG becomes VCCH (1.8 V) and the potential of the node 11*b* becomes VCCH−Vf (1.4 V). Therefore, the transistors are avoided from exceeding the withstand voltage value 1.5 V.

In the actual operation, however, there is a case where a signal is fixed to H or L for a long time (steady state). FIG. 11B shows a waveform diagram in a steady state, where the periods (1) and (2) are assumed to be sufficiently long. During the period of the input signal IN being H (period (1)), since N21 is on, the potential of the signal PG is GND+Vf (0.4 V) initially. However, since a diode current responsive to the potential difference between the nodes 11*a* and 11*b* continues to flow to D11, the potential of the signal PG gradually decreases with the lapse of time. As a result, there is a possibility that P11 and P21 may exceed the withstand voltage value.

Also, during the period of the input signal IN being L (period (2)), since P21 is on, the potential of the node 11*b* is VCCH−Vf (1.4 V) initially. However, since the diode current responsive to the potential difference between the nodes 11*a* and 11*b* continues to flow to D11, the potential of the node 11*b* gradually increases with the lapse of time. As a result, there is a possibility that N21 may exceed the withstand voltage value.

In contrast to the above, in this embodiment, the circuit 11B operates as follows. As shown in FIG. 12A, in the circuit 11B, N21 and N31 are on during the period of the input signal IN being H (period (1)). Therefore, the potential of the signal PG is a value obtained by dividing VCCH (1.8 V) by three diodes D11, D12, and D13, which is 0.6 V here. As a result, P11 and P21 are avoided from exceeding the withstand voltage value.

During the period of the input signal IN being L (period (2)), since P21 is on, PG=VCCH (1.8 V). However, since N31 is off, the potential of the node 11*a* is $$VCCL - |Vthn31| = 0.8 - 0.5 = 0.3 \text{ V}.$$

Therefore, since the potential of the node 11*b* is determined to be 0.3 V or less, N21 is avoided from exceeding the withstand voltage value.

In the steady state, the circuit 11B operates as shown in FIG. 12B. During the period of the input signal IN being H (period (1)), N21 and N31 are on, and the potential of the signal PG is 0.6 V. At this time, since a steady current is occurring in D11, D12, and D13, PG=0.6 V remains constant even after the lapse of a sufficiently long time. As a result, P11 and P21 are avoided from exceeding the withstand voltage value.

During the period of the input signal IN being L (period (2)), P21 is on, and PG=VCCH (1.8 V). However, since N31 is off, the potential of the node 11$a$ is $$VCCL - |Vthn31| = 0.8 - 0.5 = 0.3 \text{ V}.$$

Therefore, since the potential of the node 11$b$ is determined to be 0.3 V or less even after the lapse of a sufficiently long time, N21 is avoided from exceeding the withstand voltage value.

As described above, with the placement of N31 in the circuit 11B, the voltage endurance of N21 is secured irrespective of the number of stages of D11. It is therefore possible to minimize the number of stages of D11. Also, the potential of the signal PG when the input signal IN is H is determined by voltage division by D11 to D13. Therefore, by reducing the number of stages of D11, the numbers of stages of D12 and D13 can also be reduced. This makes it possible to implement the circuit in a smaller area.

Figure 13:
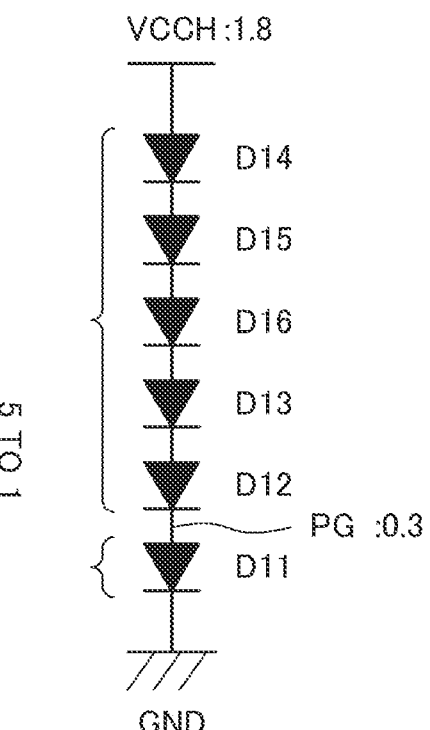
FIG. 13 shows a configuration example with diodes added to the circuit 11B in the third embodiment.
Figures 14A, 14B, 14C, 14D:
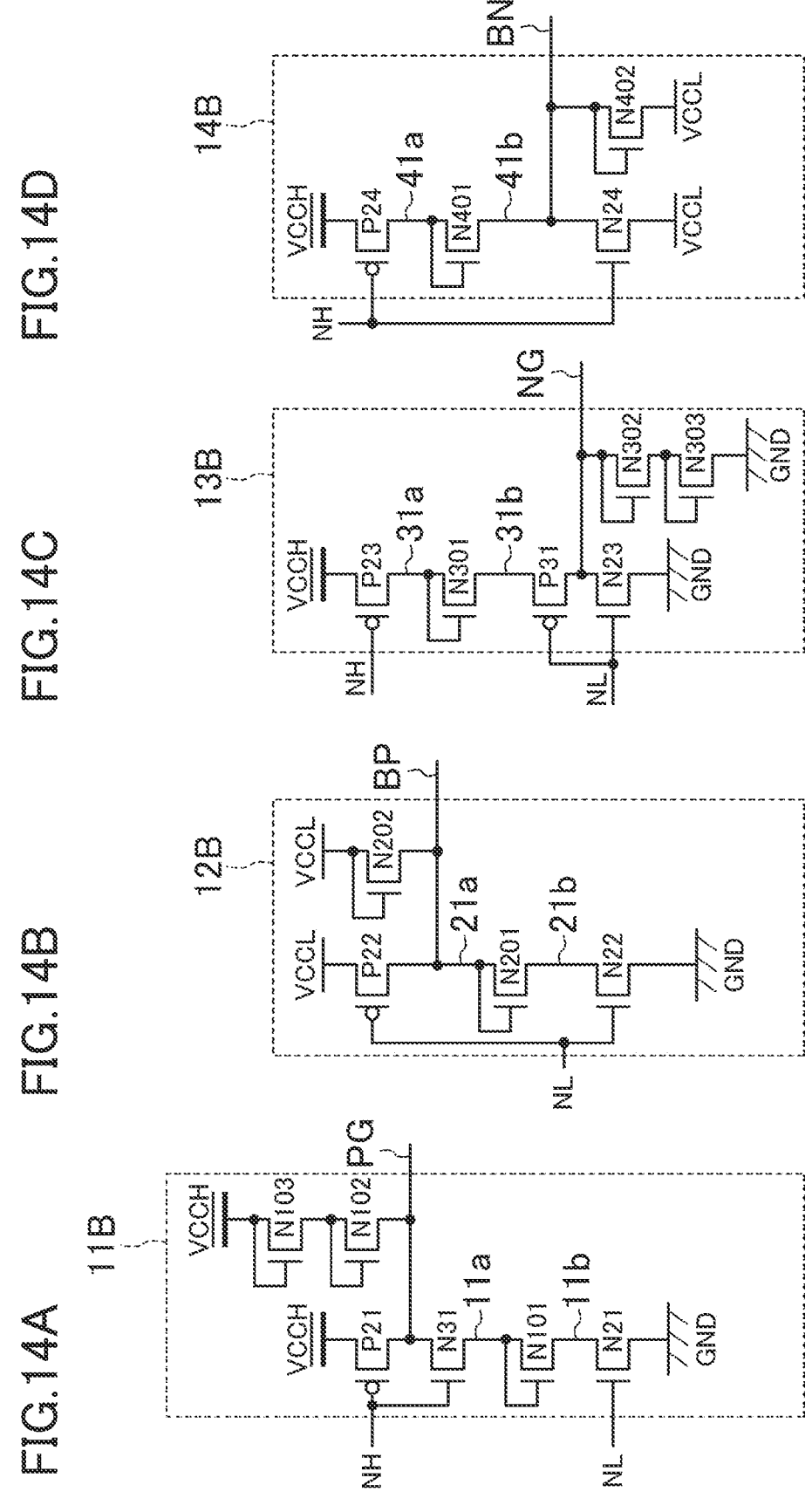
FIGS. 14A-14D show circuit configurations in which diodes are implemented by self-biased transistors.
Figures 15A, 15B, 15C, 15D:
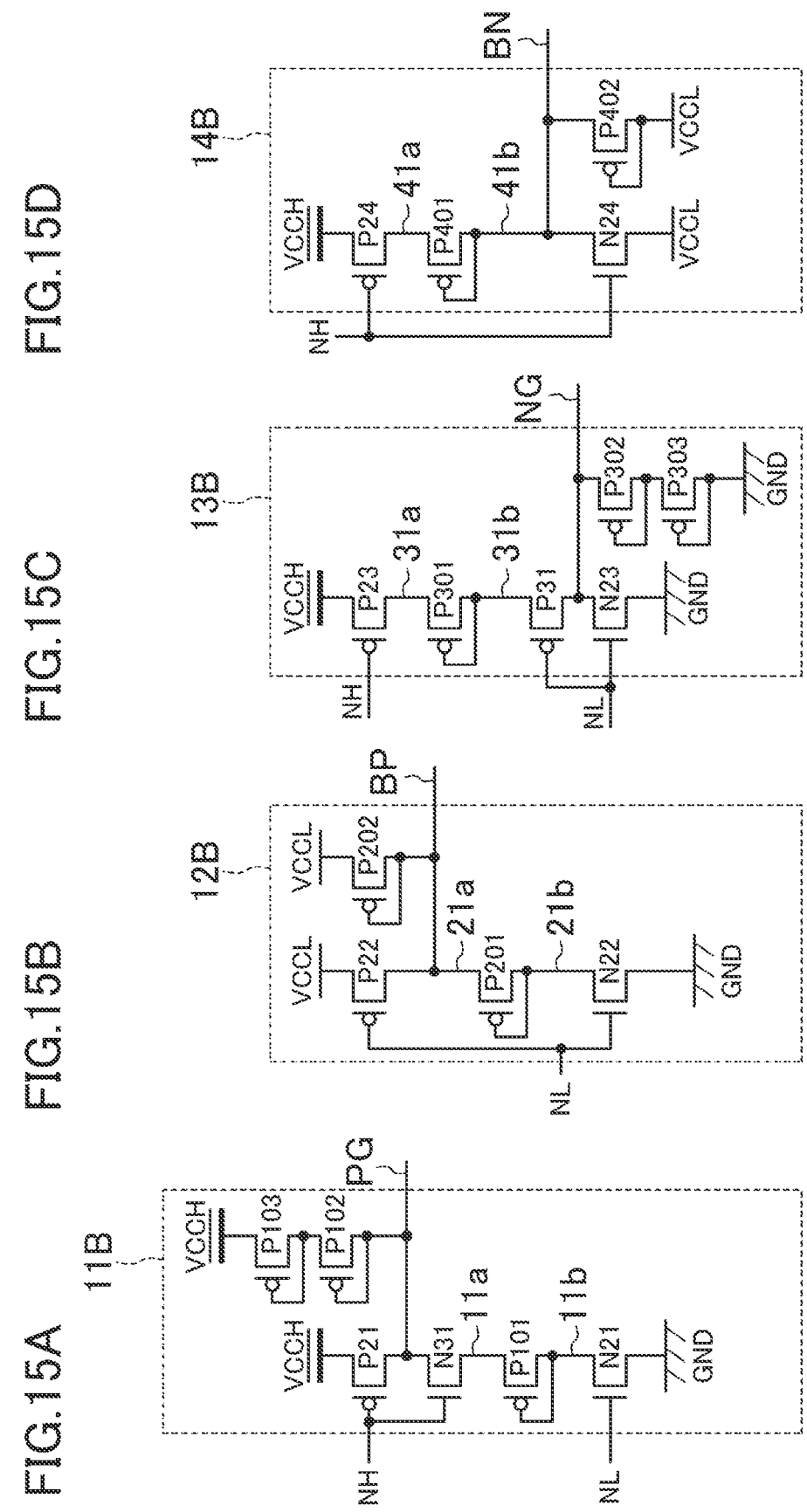
FIGS. 15A-15D show circuit configurations in which diodes are implemented by self-biased transistors.

Also, in the circuit 11B, the potential of the signal PG can be fixed to a given value depending on the number of diodes provided between VCCH and the drain of P21. For example, as shown in FIG. 13, assume that diodes D14, D15, and D16 are additionally provided between D13 and VCCH. At this time, since a total of five diodes are present between the power supply VCCH and the signal line of PG, the potential of the signal PG is $$PG = VCCH \times (1/6) = 1.8/6 = 0.3 \text{ V}.$$

The gate-source voltage |Vgsp11| of P11 is then 1.5 (=1.8–0.3) V: i.e., it can be set at the maximum value for the transistor having a withstand voltage of 1.5 V. This voltage value remains constant even in the steady state. Therefore, P11 can be used with its optimum drive capability.

The circuits 12B, 13B, and 14B also operate similarly to the circuit 11B. That is, in the circuit 12B, when the input signal IN becomes H, making the signal NL H, N22 turns on. At this time, the potential of the signal BP becomes a value obtained by dividing VCCL by two diodes D21 and D22, and this remains constant even in the steady state.

In the circuit 13B, during the period of the input signal IN being L, P23 and P31 are on. Therefore, the potential of the signal NG (H) is a value obtained by dividing VCCH by three diodes D31, D32, and D33, and this remains constant even in the steady state. During the period of the input signal IN being H, N23 is on. Therefore, the potential of the signal NG (L) is GND, but, since P31 is off, the potential of the node 31$b$ is $$VCCL + |Vthp31| = 0.8 + 0.5 = 1.3 \text{ V}.$$

Therefore, since the potential of the node 31$a$ is determined to be 1.3 V or more, P23 is avoided from exceeding the withstand voltage value even in the steady state.

In the circuit 14B, when the input signal IN becomes L, making the signal NH L, P24 turns on. At this time, the potential of the signal BN becomes a value obtained by dividing (VCCH −VCCL) by two diodes D41 and D42, and this remains constant even in the steady state.

As described above, in this embodiment, the signals PG, BP, BN, and NG can be stabilized even when the signals are in the steady state where they are fixed to H or L for a long time. Also, the drive capability of the transistors can be enhanced within the range not exceeding the withstand voltage.

Note that the second embodiment and the third embodiment may be combined.

In the above embodiments, as each diode, a self-biased transistor of which the gate is connected to its drain may be used in place of the diode element. A p-type or n-type transistor can be used in this case.

FIGS. 14A-14D show circuit configuration examples implemented using self-biased NMOSs as diodes, respectively corresponding to the circuits 11B, 12B, 13B, and 14B in the output circuit 3 of the third embodiment. In FIGS. 14A-14D, the diodes are individually replaced with NMOSs, like the diode D11 being replaced with an NMOS N101, for example.

FIGS. 15A-15D show circuit configuration examples implemented using self-biased PMOSs as diodes, respectively corresponding to the circuits 11B, 12B, 13B, and 14B in the output circuit 3 of the third embodiment. In FIGS. 15A-15D, the diodes are individually replaced with PMOSs, like the diode D11 being replaced with a PMOS P101, for example.

Note that the voltage values of VCCL and VCCH and the withstand voltage and threshold voltage of the transistors used in the description of the above embodiments are mere examples and by no means intended to restrict the present disclosure.

According to the present disclosure, a highly-reliable output circuit suitable for high-speed operation can be implemented using low-withstand voltage transistors. The present disclosure is therefore useful in implementing high-performance, low-power semiconductor chips for communications, for example.

The invention claimed is:

1. An output circuit for outputting an output signal responsive to an input signal having an amplitude corresponding to a first power supply voltage from an output terminal, the output signal having an amplitude corresponding to a second power supply voltage greater than the first power supply voltage, the output circuit comprising:

first and second p-type transistors connected in series between a second power supply supplying the second power supply voltage and the output terminal;

a first n-type transistor grounded at its source and receiving a first signal responsive to the input signal at its gate, the first signal having an amplitude from a ground voltage to a first predetermined voltage;

a third p-type transistor connected to the second power supply at its source, connected to a gate of the first p-type transistor at its drain, and receiving a second signal responsive to the input signal at its gate, the second signal having an amplitude from the first predetermined voltage to the second power supply voltage;

a first diode including one diode or a plurality of serially connected diodes, connected between the drain of the third p-type transistor and a drain of the first n-type transistor, a second diode including one diode or a plurality of serially connected diodes, connected between the second power supply and the drain of the third p-type transistor, and a second n-type transistor provided between the drain of the third p-type transistor and the first diode, and receiving the second signal at its gate, wherein the first predetermined voltage is the same as the first power supply voltage.

2. The output circuit of claim 1, wherein the first diode includes a plurality of serially connected first diodes, and the output circuit further comprises:

a pulse generation circuit generating a pulse signal, the pulse signal generating a pulse for a predetermined period at a rising transition of the first signal; and a transistor connected, at its source and drain, to both ends of a part of the first diodes, receiving the pulse signal at its gate, and being on for the predetermined period during which the pulse is generated.

\* \* \* \* \*